(12) United States Patent
Roohparvar et al.

(10) Patent No.: US 8,400,826 B2
(45) Date of Patent: *Mar. 19, 2013

(54) COARSE AND FINE PROGRAMMING IN A SOLID STATE MEMORY

(75) Inventors: Frankie F. Roohparvar, Monte Sereno, CA (US); Vishal Sarin, Cupertino, CA (US); Jung S. Hoei, Newark, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/590,376

(22) Filed: Aug. 21, 2012

(65) Prior Publication Data

US 2012/0314503 A1     Dec. 13, 2012

Related U.S. Application Data

(60) Continuation of application No. 13/094,409, filed on Apr. 26, 2011, now Pat. No. 8,259,491, which is a division of application No. 11/818,683, filed on Jun. 15, 2007, now Pat. No. 7,936,599.

(51) Int. Cl.
  *G11C 16/04* (2006.01)
(52) U.S. Cl. ......... 365/185.02; 365/185.03; 365/185.17; 365/185.19
(58) Field of Classification Search ............. 365/185.02, 365/185.03, 185.17, 185.19, 185.18
See application file for complete search history.

(56) References Cited

U.S. PATENT DOCUMENTS

| | | | |
|---|---|---|---|
| 5,295,255 A | 3/1994 | Malecek et al. | |
| 6,343,033 B1 | 1/2002 | Parker | |
| 7,158,421 B2 | 1/2007 | Li et al. | |
| 7,558,122 B2 | 7/2009 | Kim et al. | |
| 7,936,599 B2 * | 5/2011 | Roohparvar et al. | .... 365/185.02 |
| 8,107,296 B2 | 1/2012 | Sarin et al. | |
| 8,259,491 B2 * | 9/2012 | Roohparvar et al. | .... 365/185.02 |
| 2009/0129146 A1 | 5/2009 | Sarin et al. | |
| 2010/0208524 A1 | 8/2010 | Sarin et al. | |

FOREIGN PATENT DOCUMENTS

KR   2006-0087447 A   8/2006

\* cited by examiner

*Primary Examiner* — Andrew Q Tran
(74) *Attorney, Agent, or Firm* — Leffert Jay & Polglaze, P.A.

(57) ABSTRACT

Memory devices adapted to receive and transmit analog data signals representative of bit patterns of two or more bits facilitate increases in data transfer rates relative to devices communicating data signals indicative of individual bits. Programming of such memory devices includes initially programming a cell with a coarse programming pulse to move its threshold voltage in a large step close to the programmed state. The neighboring cells are then programmed using coarse programming. The algorithm then returns to the initially programmed cells that are then programmed with one or more fine pulses that slowly move the threshold voltage in smaller steps to the final programmed state threshold voltage.

20 Claims, 10 Drawing Sheets

US 8,400,826 B2

COARSE AND FINE PROGRAMMING IN A SOLID STATE MEMORY

RELATED APPLICATION

This is a continuation of U.S. patent application Ser. No. 13/094,409, filed Apr. 26, 2011 now U.S. Pat. No. 8,259,491 and titled, "COARSE AND FINE PROGRAMMING IN A SOLID STATE MEMORY," which is a divisional of Ser. No. 11/818,683, now U.S. Pat. No. 7,936,599, filed Jun. 15, 2007, which are commonly assigned and incorporated herein by reference.

TECHNICAL FIELD

The present disclosure relates generally to semiconductor memory and, in particular, the present disclosure relates to solid state non-volatile memory devices.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, cellular telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons stated below which will become apparent to those skilled in the art upon reading and understanding the present specification, there is a need in the art for alternative bulk storage options.

DETAILED DESCRIPTION

Figure 1:
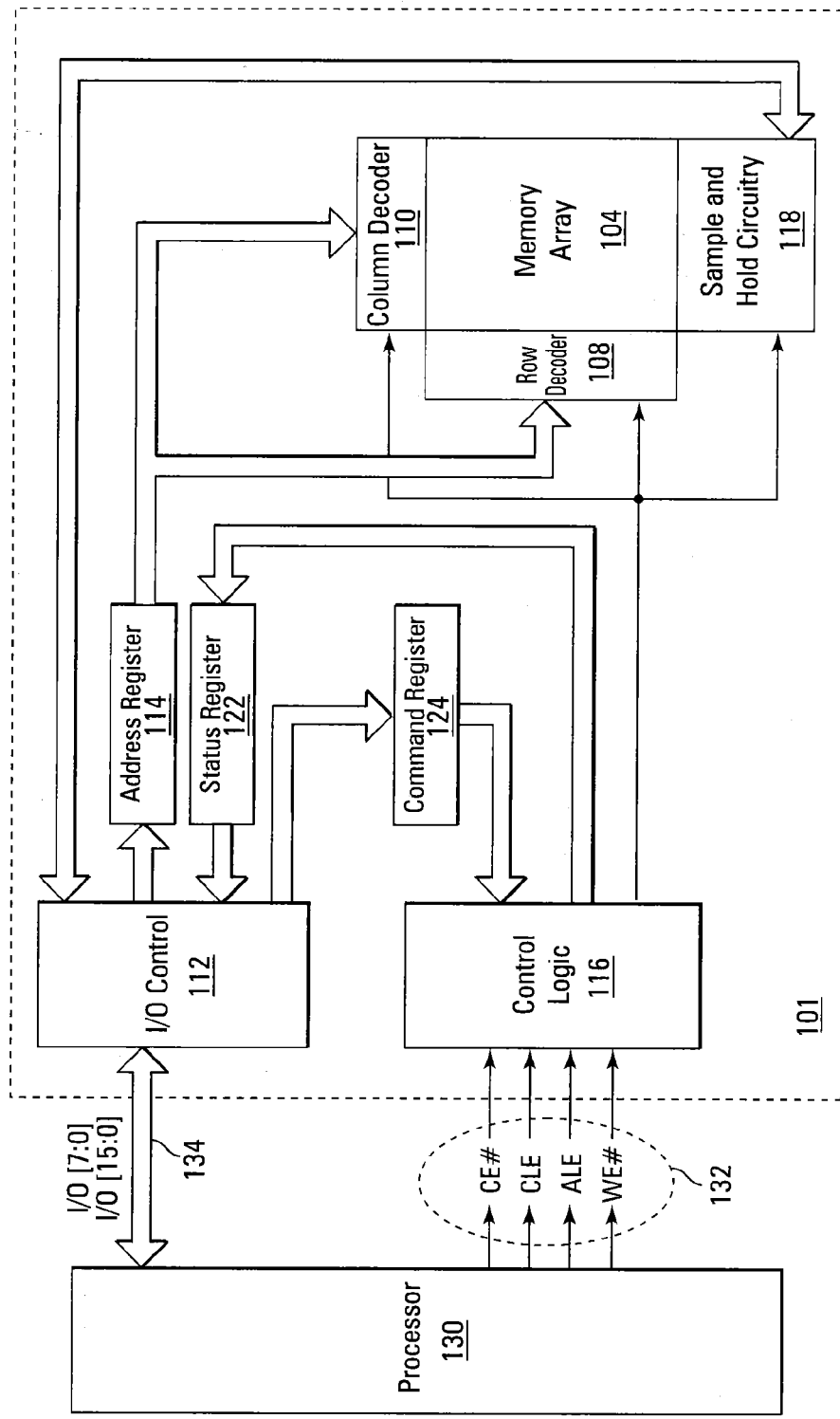
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage ($V_t$) ranges of 200 mV for each range, with each range corresponding to a distinct data state, thereby representing four data values or bit patterns. Typically, a dead space or margin of 0.2V to 0.4V is between each range to keep the $V_t$ distributions from overlapping. If the $V_t$ of the cell is within the first range, the cell may be deemed to store a logical 11 state and is typically considered the erased state of the cell. If the $V_t$ is within the second range, the cell may be deemed to store a logical 10 state. If the $V_t$ is within the third range, the cell may be deemed to store a logical 00 state. And if the $V_t$ is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the $V_t$ of the target memory cell is moved from the $V_t$ range corresponding to the 11 logic state to the Vt range corresponding to the 10 logic state. Following programming of the LSBs, the most-significant bit (MSB) of each cell is programmed in a similar manner, shifting the $V_t$ where necessary. When reading an MLC of a traditional memory device, one or more read operations determine generally into which of the ranges the $V_t$ of the cell voltage falls. For example, a first read operation may determine whether the $V_t$ of the target memory cell is indicative of the MSB being a 1 or a 0 while a second read operation may determine whether the $V_t$ of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as $V_t$ ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value or bit pattern of the cell. The memory devices of the various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital bit pattern and to convert write data from a digital bit pattern to an analog signal such that the memory device 101 could be adapted for communication with either an analog or digital data interface.

During a write operation, target memory cells of the memory array 104 are programmed until voltages indicative of their $V_t$ levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the $V_t$ levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
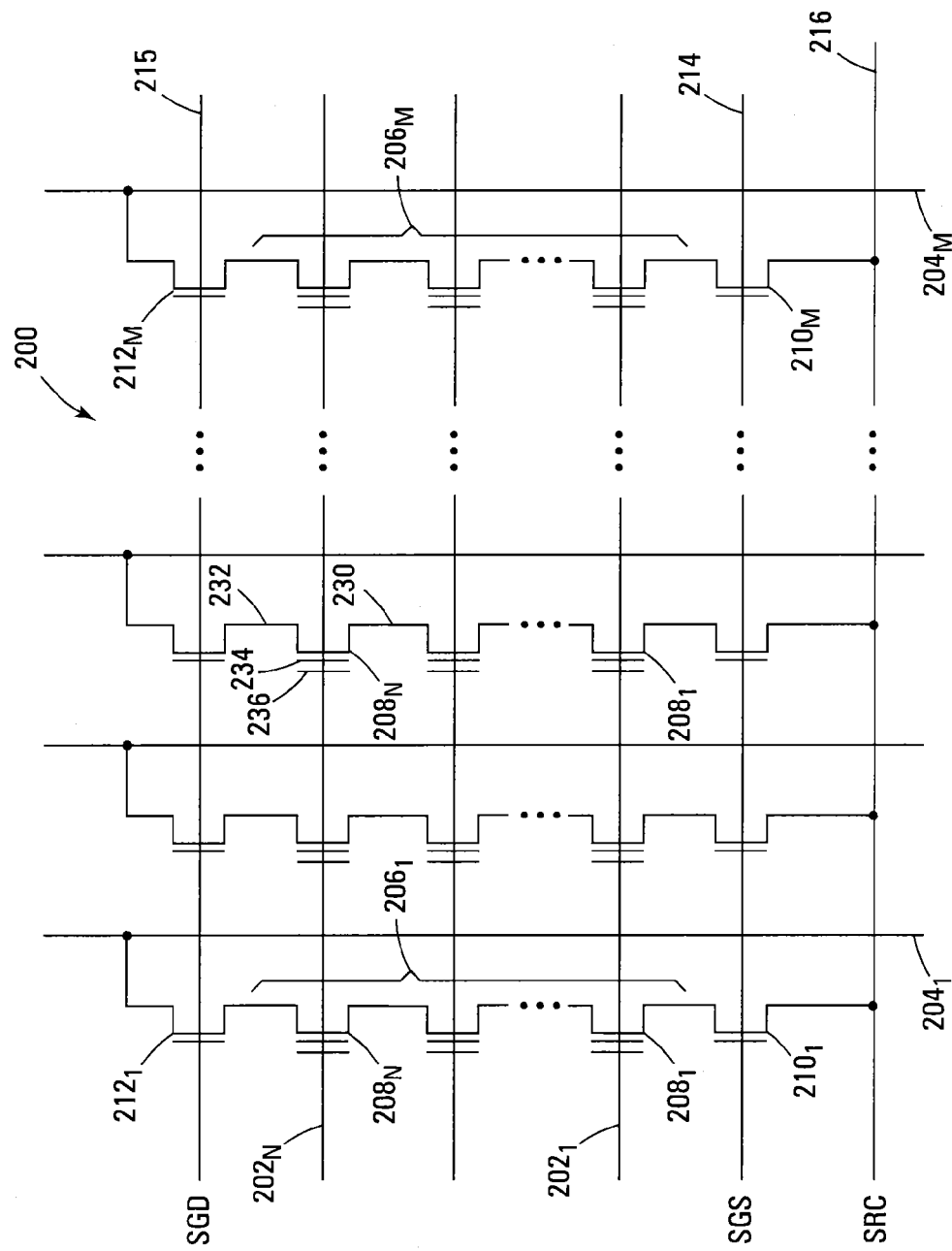
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
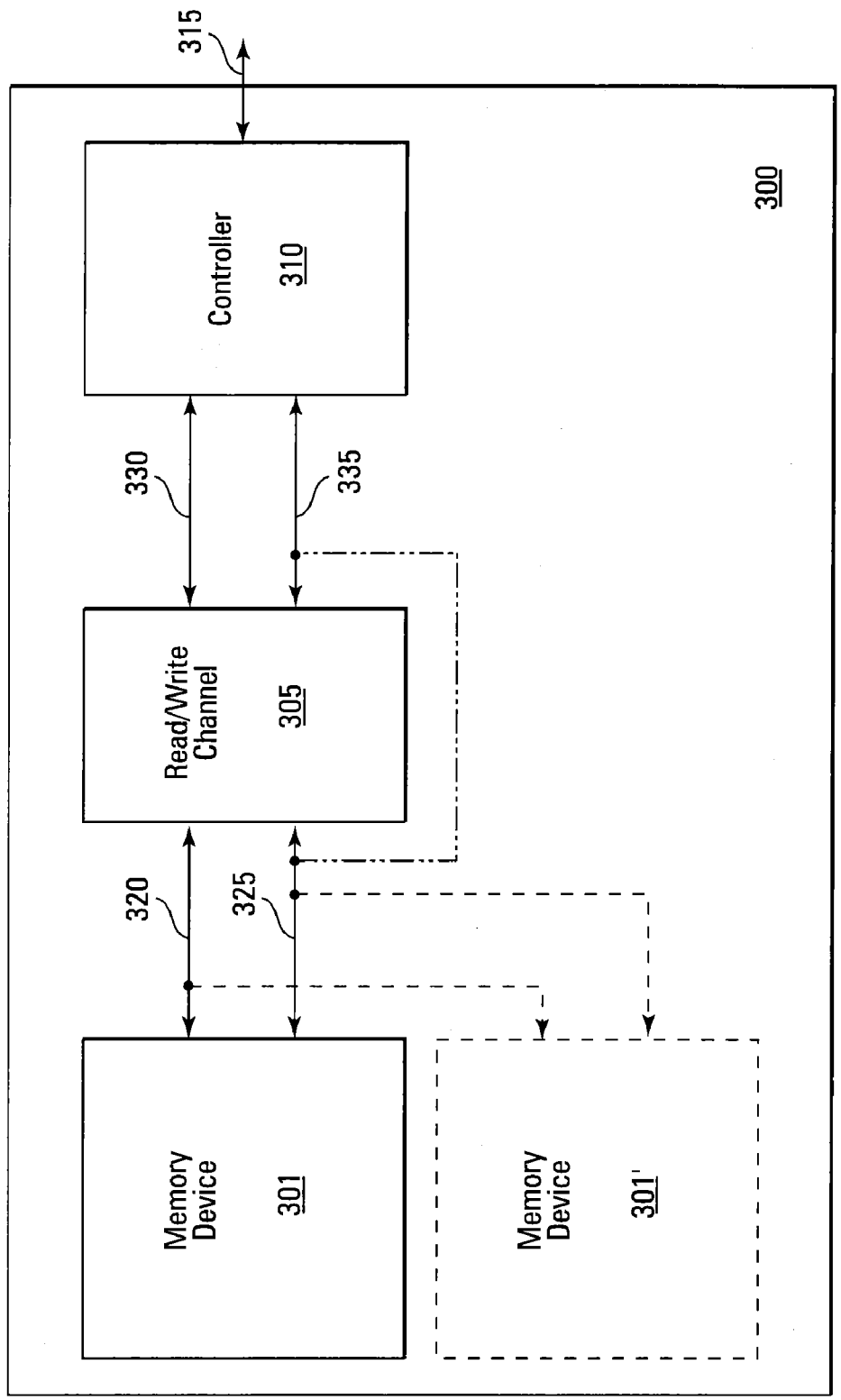
FIG. 3 is a block schematic of a solid state bulk storage system in accordance with one embodiment of the present disclosure.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital data stream to an analog data stream and vice versa. A digital data stream provides data signals in the form of binary voltage levels, i.e., a first voltage level indicative of a bit having a first binary data value, e.g., 0, and a second voltage level indicative of a bit having a second binary data value, e.g., 1. An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
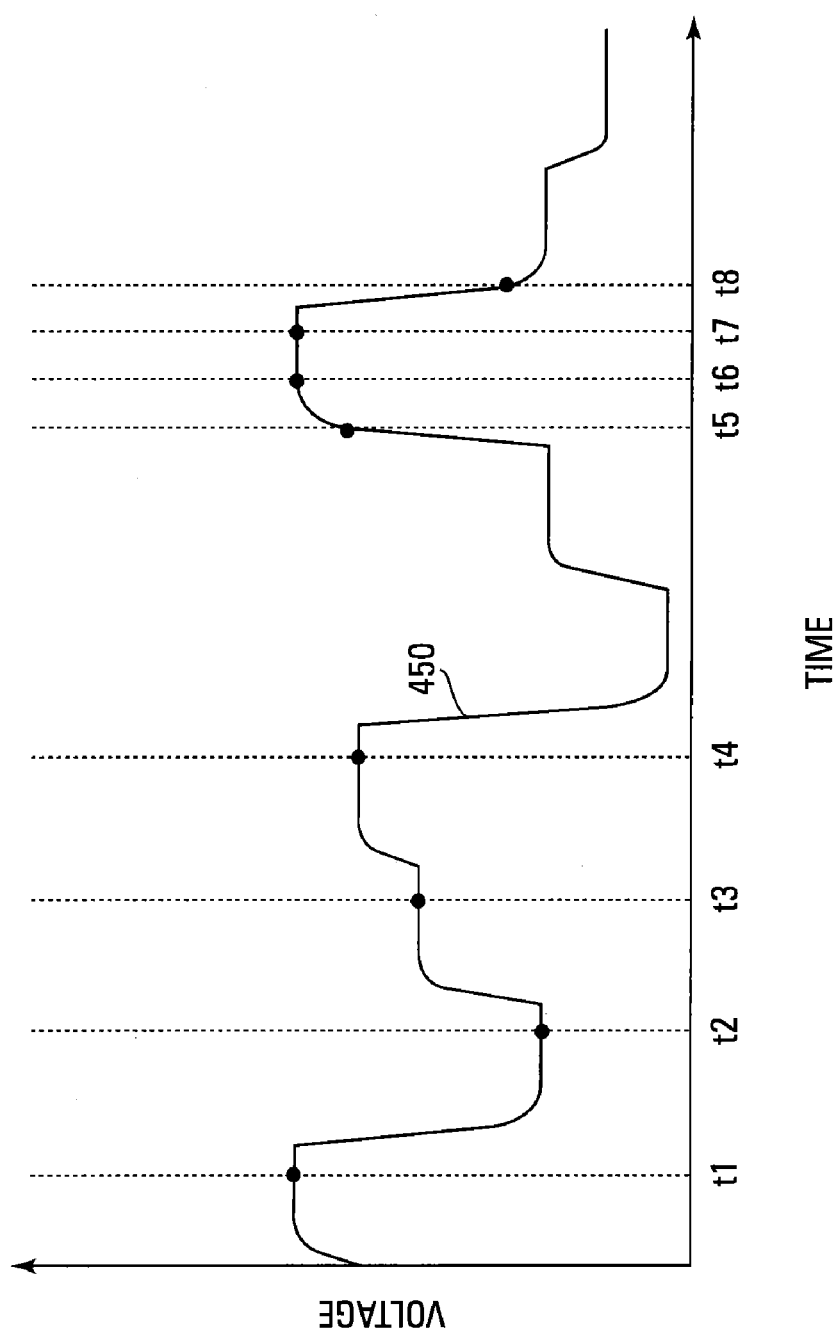
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
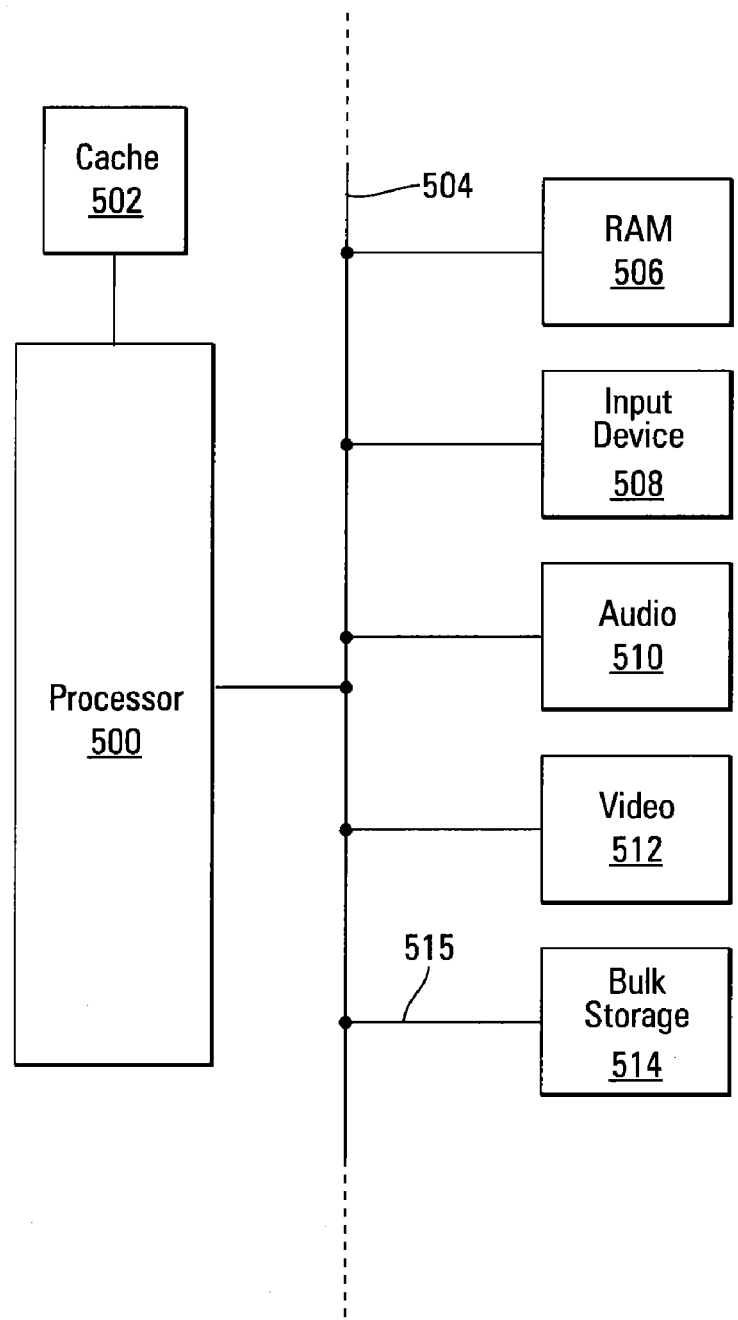
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

The programming of the above-described memory array has an affect not only on the target cell or cells but also on the neighboring cells of the target cell(s). This effect is typically referred to in the art as program disturb. The larger the programming voltage used, the greater the affect on neighboring cells. For example, assume one erased cell has an erased threshold voltage ($V_t$) of −3V and is to be programmed to a programmed state having a $V_t$ of 3V and a second erased cell has a $V_t$ of −1V and is to be programmed to a 1V state. The first cell's $V_t$ has to be moved 6V while the second cell only has to move 2V. Due to the much larger voltage swing of the first cell, programming the first cell requires a larger program voltage on the word line and, thus, will have a greater impact on neighboring cells than programming the second cell.

Floating gate-to-floating gate coupling is another mechanism by which the programming of neighboring cells affects the data that was programmed in an earlier cell or cells. Data is programmed into a cell by changing the charge stored in floating gate of the cell. However, as the charge on the floating gates of neighboring cells is changed, it disturbs the charge stored on the previously programmed floating gate(s). This is a result of capacitive coupling between floating gates of neighboring cells. The neighboring cells include vertically above and below on a bit line, horizontally left and right on a word line, and diagonally between bit lines.

The embodiments of the present disclosure provide a programming algorithm for mitigating the effect of floating gate-to-floating gate coupling through coarse and fine programming to improve overall programming speed. The present disclosure provides coarse programming steps and fine programming steps to reduce program convergence speed, reduce program disturb and reduce floating gate-to-floating gate coupling related disturb experienced by cells being programmed.

Figure 6:
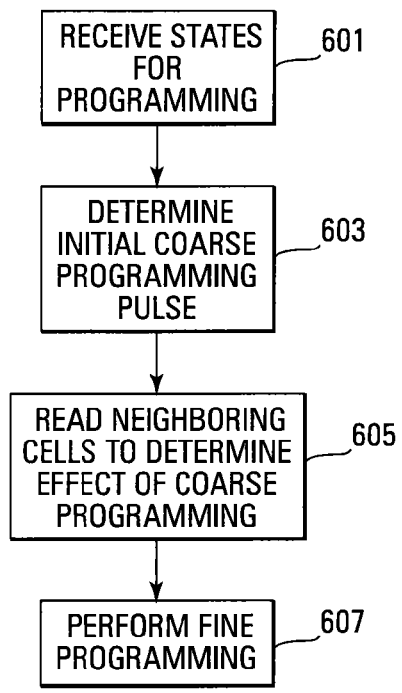
FIG. 6 is a flowchart of one embodiment of a method for programming a memory device of the present disclosure.

FIG. 6 illustrates a flowchart of one embodiment of a method for memory cell programming using coarse and fine programming pulses. The method begins with the receipt of a program/write command that contains the desired programmed states 601 for the cell or cells being programmed. The memory device receives the program command from an external processor or other type of external controller circuitry. The read/write channel, described previously in FIG. 3, receives the digital representations of the threshold voltages of the states to be programmed and converts the digital signals to analog representations of the threshold voltages. In an alternate embodiment, an analog voltage is received by the memory device that is converted to a digital representation by an analog-to-digital conversion on the memory device.

The memory device control logic then determines the magnitude of the coarse programming pulse that is applied to each memory cell being programmed 603. The coarse programming pulse is the initial programming step that requires the largest voltage on the word line. Thus, the maximum program disturb is experienced on the first programming pulse since the effects on neighboring cells can be fixed with smaller, less disturbing programming pulses.

In one embodiment, the magnitude of the coarse programming pulse is set in response to the data to be programmed into the target memory cell as well as the data being programmed in neighboring memory cells. The programming pulse generation algorithm uses the desired state (i.e., threshold voltage) of the target memory cell to determine the programming voltage required to reach a certain percentage of that threshold voltage. This programming pulse is then used to bias the target memory cell. The threshold voltages of adjacent memory cells are then read to determine the effect of the coarse programming pulse 605. For example, a programming pulse might be 16V to move the target cell's threshold voltage from −3V to 0V. After this programming pulse, the adjacent memory cells are read to determine their current threshold voltages after the program disturb effects caused by the target cell coarse programming. The coarse programming of the adjacent memory cells takes into account the new threshold voltages by using the new threshold voltages as the starting point for the programming of the adjacent cells. The adjacent cells are then programmed with their own respective coarse programming voltage.

After the coarse programming has been accomplished, each of the memory cells being programmed is within a certain percentage of its programmed state. The memory cells are then programmed to their final respective states by fine programming pulses 607. The smaller, fine pulses move each cell's respective threshold voltage to the final state in smaller increments. The smaller programming voltages cause less of an impact on neighboring cells. For example, the threshold voltages are moved in increments of a tenth volt or less during the fine programming instead of the volt or multiple volt increments of the coarse programming.

Figure 7:
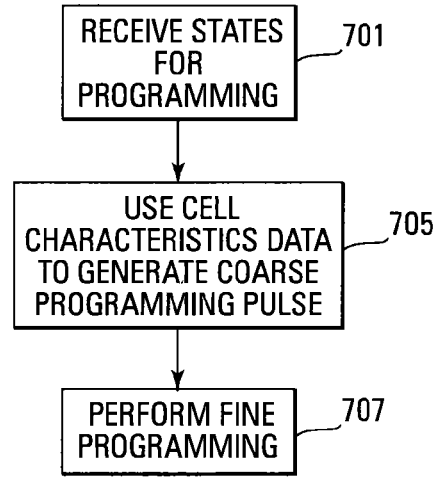
FIG. 7 is a flowchart of an alternate embodiment of a method for programming a memory device of the present disclosure.

FIG. 7 illustrates a flowchart of another embodiment of the coarse and fine programming method of the present disclosure. The method begins with the receipt of a program/write command that contains the desired programmed states 701 for the cell or cells being programmed. The memory device receives the program command from an external processor or other type of external controller circuitry. The read/write channel, described previously in FIG. 3, receives the digital representations of the threshold voltages of the states to be programmed and converts the digital signals to analog representations of the threshold voltages.

The control logic then accesses cell characteristics data 705 that is stored in memory. The cell characteristics data is representative of a memory block's average behavior in response to neighboring cell changes. Alternate embodiments use a memory page's average behavior or the average behavior of the entire memory array.

The cell characteristics data is used by the programming pulse generation algorithm in determining the voltage level of the coarse programming pulse. For example, if the characteristics data shows that, on average, the threshold voltages of cells do not move easily in response to a program disturb condition, the programming voltage can be made larger than normal. If the characteristics data shows that, on average, the threshold voltages of cells move easily in response to a program disturb condition, the programming pulse is made smaller. Thus reducing the program disturb condition on neighboring cells.

The programming pulse generation algorithm then determines the distance that the threshold voltage of the target cell needs to move to reach a predetermined percentage of the programmed state. The programming pulse voltage required to move the threshold voltage of the target cell this distance is determined and then adjusted in response to the characteristics data 705. This pulse is then used to bias the word line coupled to the target cell. This is repeated for all of the cells to be programmed.

Once the cells to be programmed have gone through the coarse programming step, each cell is then programmed in smaller steps with the fine programming pulses 707. As in the previous embodiment, these pulses are substantially smaller than the coarse programming pulses in order to reduce the program disturb condition on the word line. The fine programming pulses, in one embodiment, move the threshold voltages in multiple tenth volt or millivolt steps while the coarse programming pulses move the threshold voltages in a single step of a volt or greater.

The fine programming pulses may be all the same voltage that has been determined to move the threshold voltage to the programmed state. The fine programming pulses can also be a plurality of different voltages as necessary to move the threshold voltage to the programmed state.

Figure 8:
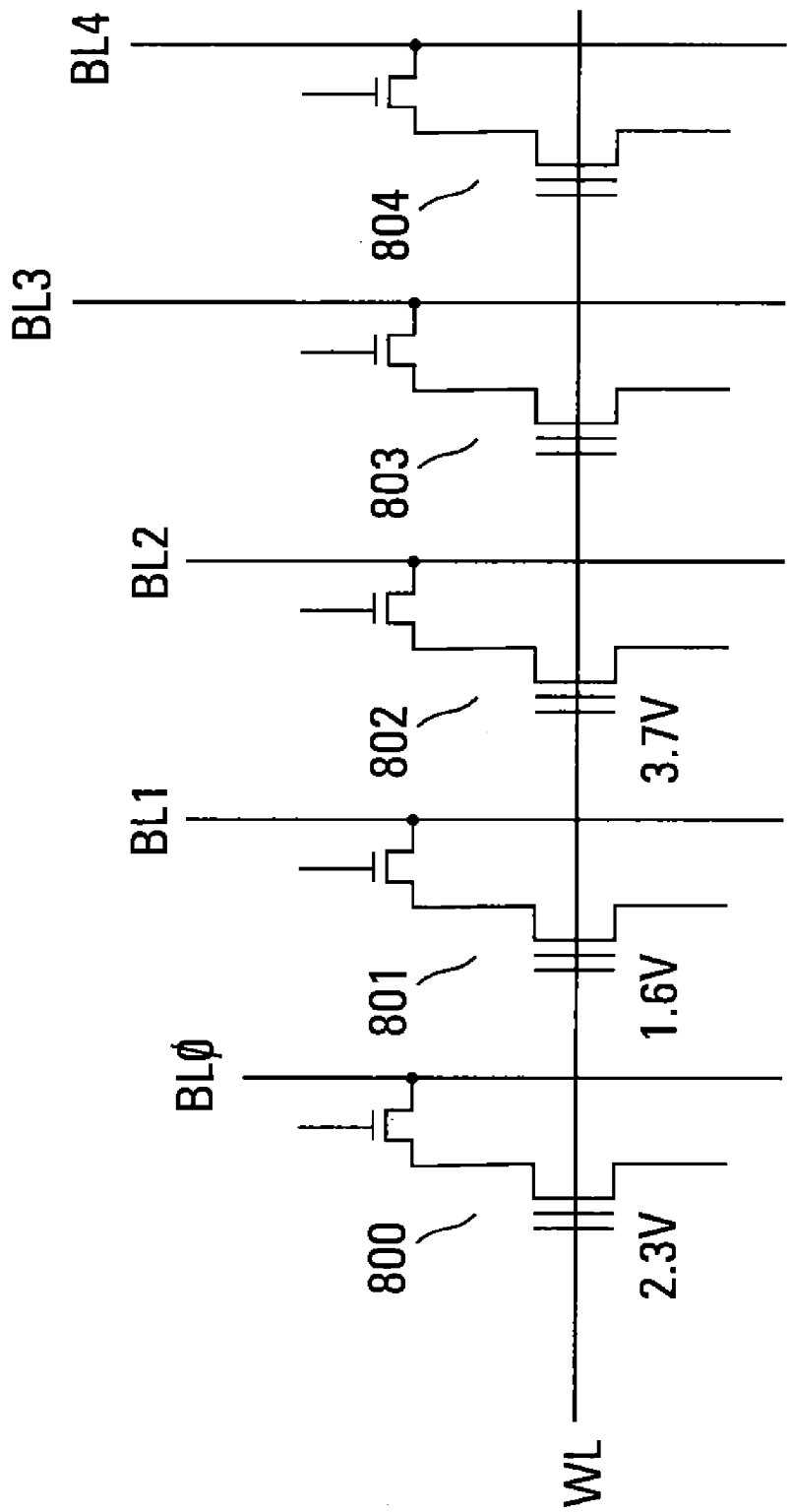
FIG. 8 is a schematic of one embodiment of a portion of a NAND memory array in accordance with the programming methods, of FIGS. 6 and 7.

FIG. 8 illustrates a schematic diagram of one embodiment of a portion of a NAND memory array to be programmed using the programming methods of the present disclosure. The NAND architecture uses a word line WL that is coupled to a row of memory cells 800-804. Each of the memory cells is part of a series string of memory cells coupled to a bit line BL0-BL4 through a select gate transistor.

This schematic shows an example of how the coarse and fine programming embodiments would be used to program a number of adjacent memory cells while reducing the effects of program disturb along a word line. This example assumes that all of the cells start from a negative erased state and that the first memory cell 800 is being programmed to a state that requires a threshold voltage of 2.3V, the second memory cell 801 is being programmed to a state that requires a threshold voltage of 1.6V, and the third memory cell 802 is being programmed to a state that requires a threshold voltage of 3.7V.

The initial coarse programming step might program the first cell 800 to 2.0V, the second cell 801 to 1.0V, and the third cell 802 to 3.0V. To accomplish the programming, the bit lines are biased with either an enable voltage or an inhibit voltage and, in one embodiment, the cells 800-804 are programmed alternately along the word line such that BL0, BL2, and BL4 might be enabled first while BL1 and BL3 are inhibited. In one embodiment, the enable voltage is 0V while the inhibit voltage is $V_{CC}$. An alternate embodiment only slows down the programming instead of inhibiting. In such an embodiment, a bit line bias voltage between 0V and $V_{cc}$ is used. The coarse programming pulse is generated as discussed previously with reference to the embodiments of FIGS. 6 and 7.

After the coarse programming step, the memory device controller reads the memory cells 800-802 being programmed to determine their present, respective threshold voltages. This provides the controller with the starting point for the fine programming step since the effects of the large programming pulses has changed the threshold voltages for the cells on the word line WL. The fine programming pulses can now be used to slowly move the cells being programmed 800-802 to their respective, final threshold voltages.

The fine programming pulses may be all the same voltage that has been determined to move the threshold voltage to the programmed state. The fine programming pulses can also be a plurality of different voltages as necessary to move the threshold voltage to the programmed state.

Figure 9:
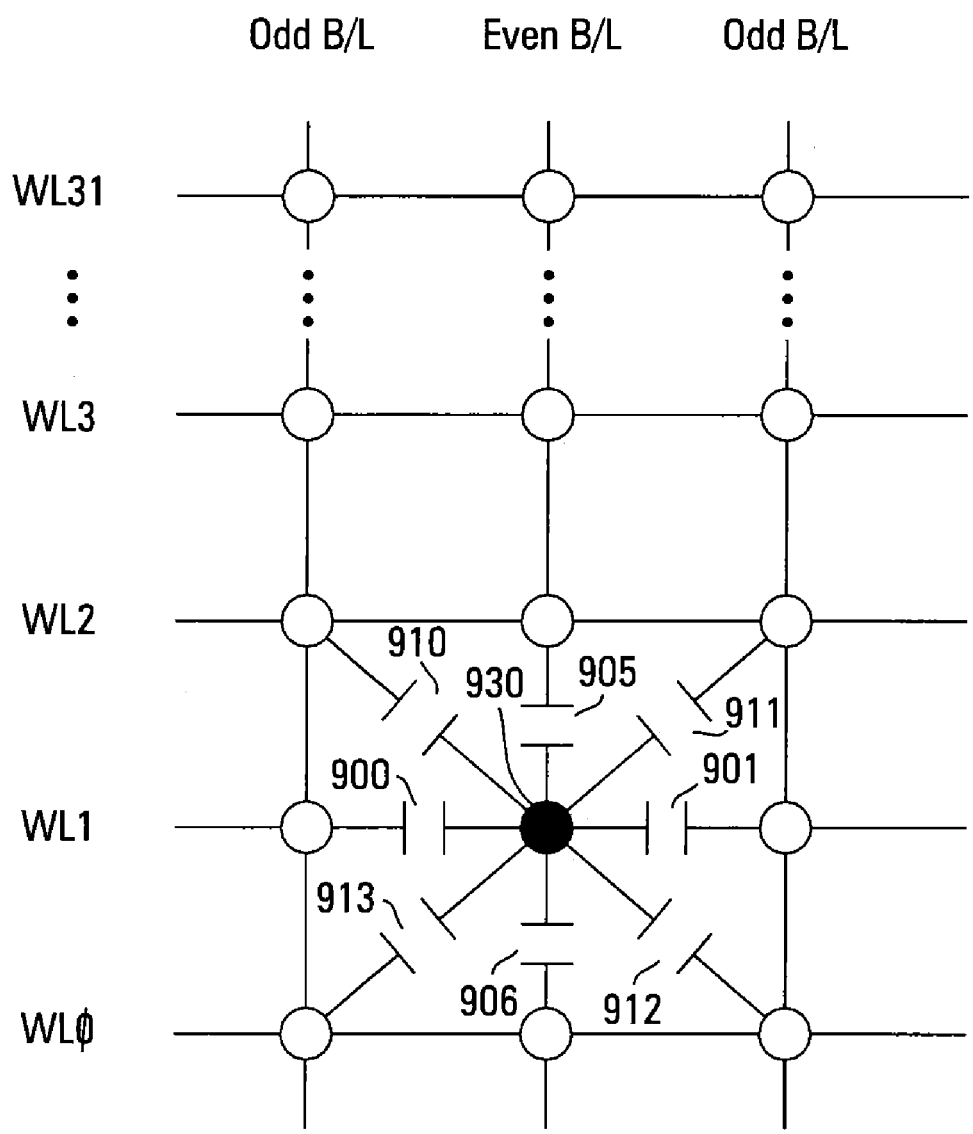
FIG. 9 is a schematic diagram of one embodiment of a NAND memory array showing floating gate-to-floating gate coupling.

FIG. 9 illustrates a schematic diagram of one embodiment of a NAND memory device of the present disclosure that experiences the floating gate-to-floating gate capacitive coupling during programming. This diagram assumes that the central cell 930 on word line WL1 is being programmed. This Figure shows the capacitive coupling 900, 901 between adjacent cells on the same word line, the capacitive coupling 905, 906 between adjacent cells along the same bit line, and the capacitive coupling 910-913 between diagonally adjacent cells.

Figure 10:
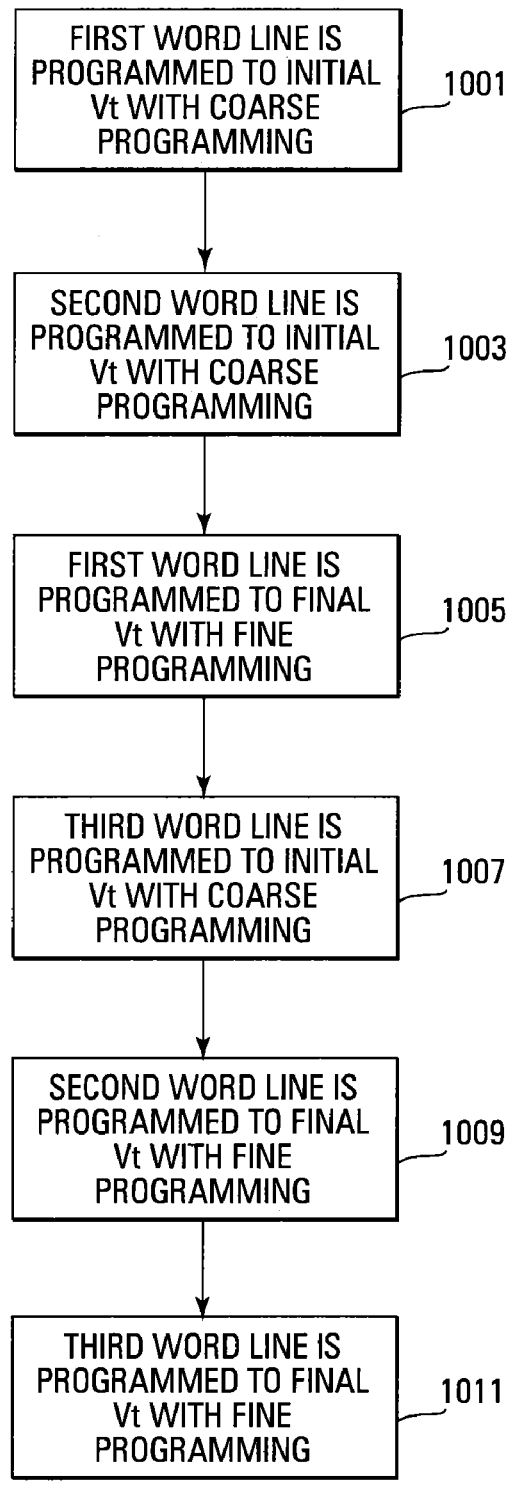
FIG. 10 is a flowchart of one embodiment of a method for programming a memory device of the present disclosure in accordance with the schematic of FIG. 9.

FIG. 10 illustrates a flowchart of one embodiment of a method for mitigating the floating gate-to-floating gate capacitive coupling using the coarse and fine programming of the present disclosure. The coarse programming programs the cells along a word line with large, high voltage steps to an initial threshold voltage. The fine programming programs the cells along the word line with smaller high voltage steps to a final threshold voltage.

The initial threshold voltage level is a voltage that is less than the final, programmed threshold voltage level by a fixed delta voltage (i.e., initial $V_t$=final $V_t$-$\Delta V_t$). The initial threshold voltage is chosen so as to give enough margin for floating gate-to-floating gate coupling (vertical, horizontal, and diagonal) and program disturb (along same word line) due to coarse programming. The final threshold voltage is the desired voltage on the cell after programming is complete.

The method illustrated in FIG. 10 first programs the cells on a first word line (i.e., WL1 in FIG. 9) to the initial $V_t$ using a coarse programming 1001. If more than one page on the first word line is to be programmed, all of the pages to be programmed are programmed prior to proceeding to the next word line.

The cells on a second word line to be programmed (i.e., WL2 in FIG. 9) are then programmed to the initial $V_t$ using the coarse programming 1003. All of the pages to be programmed on this word line are programmed to the initial $V_t$ at this time.

The threshold voltages of the memory cells to be programmed on the first word line are now raised to the final $V_t$ by fine programming 1005. All of the pages to be programmed on this word line are raised to the final $V_t$ at this time.

The threshold voltage of the memory cells to be programmed on a third word line (i.e., WL3 in FIG. 9) are then programmed to the initial $V_t$ using the coarse programming 1007. All of the pages to be programmed on this word line are programmed to the initial $V_t$ at this time.

The threshold voltages of the memory cells to be programmed on the second word line are then raised to the final $V_t$ by fine programming 1009. All of the pages to be programmed on this word line are raised to the final $V_t$ at this time.

It can be realized by those skilled in the art that it is not necessary to program to initial $V_t$ using coarse programming. It can be done using fine programming as well. Coarse programming is the preferred embodiment to save program time.

The threshold voltages of the memory cells to be programmed on the third word line are then raised to the final $V_t$ by fine programming 1011. All of the pages to be programmed on this word line are raised to the final $V_t$ at this time. This process is repeated for the entire memory block to be programmed.

Figure 11:
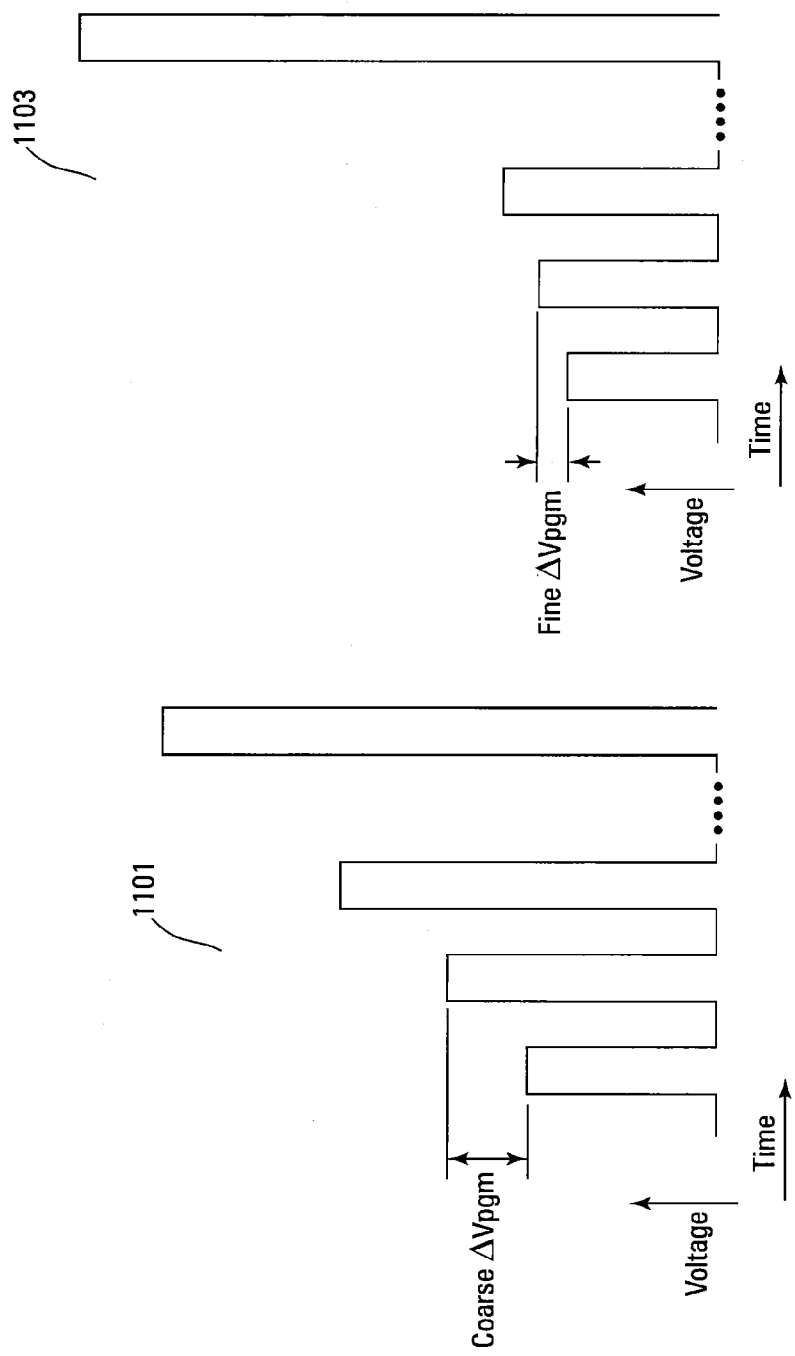
FIG. 11 is a diagram of one embodiment of coarse programming pulse increments and fine programming pulse increments.

FIG. 11 illustrates a comparison between coarse programming pulse increments and fine programming pulse increments. The left pulses 1101 illustrate one embodiment of a set of incrementing voltages used for coarse programming. These pulses typically have an initial pulse that is larger than the fine programming initial pulse and also have a $\Delta V_{pgm}$ that is greater than the fine $\Delta V_{pgm}$. For comparison, the right set of pulses 1103 illustrate one embodiment of a set of voltages used for fine programming.

CONCLUSION

The various embodiments include memory devices adapted to receive and transmit analog data signals representative of bit patterns of two or more bits. The memory devices can be programmed using coarse and fine programming. The cells are each initially programmed with the coarse programming to move their respective threshold voltage in a large step close to their respective programmed state. The cells are each then programmed with one or more fine pulses that slowly move the threshold voltage in smaller steps to the final programmed state threshold voltage.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A memory device comprising:
an array of memory cells; and
control logic coupled to the array of memory cells and configured to control programming of a plurality of memory cells of the array of memory cells, the control logic configured to determine memory cell characteristics data for the plurality of memory cells, control generation of an initial programming voltage for each of the plurality of memory cells in response to the cell characteristics data and a respective state to be programmed into each memory cell wherein the initial programming voltage programs each of the plurality of memory cells to a respective interim state, and control generation of at least one subsequent programming voltage for each of the plurality of memory cells such that each subsequent programming voltage is generated in response to a respective interim state and a programmed state of each memory cell wherein each subsequent programming voltage is less than its respective initial programming voltage.

2. The memory device of claim 1 wherein the plurality of memory cells are coupled to a same word line of a plurality of word lines of the memory array.

3. The memory device of claim 1 and further comprising a read/write channel that couples the memory device to an external controller.

4. The memory device of claim 3 wherein the read/write channel is configured to receive digital representations of threshold voltages of the respective states to be programmed and convert the digital representations to analog representations of the threshold voltages.

5. The memory device of claim 3 wherein the read/write channel is configured to receive analog voltage representations of threshold voltages of the respective states to be programmed and convert the analog representations to digital representations of the threshold voltages.

6. The memory device of claim 3 wherein the memory device is part of a bulk storage device comprising a plurality of memory devices coupled to a controller through the read/write channel.

7. The memory device of claim 6 wherein each memory device is coupled to the read/write channel through an analog interface and a digital interface.

8. The memory device of claim 7 wherein the analog interface is configured to convey analog signals and the digital interface is configured to convey status signals and control signals.

9. A memory device comprising:
an array of memory cells comprising a plurality of memory cells coupled to a word line; and
control logic coupled to the array of memory cells and configured to control programming of the plurality of memory cells of the array of memory cells, the control logic configured to receive a plurality of respective states to be programmed, determine memory cell characteristics data for the plurality of memory cells, control generation of an initial programming voltage for each of the plurality of memory cells in response to the cell characteristics data and the respective state to be programmed into each memory cell wherein the initial programming voltage programs each of the plurality of memory cells to a respective interim state, and control generation of at least one subsequent programming voltage for each of the plurality of memory cells such that each subsequent programming voltage is generated in response to the respective interim state and a programmed state of each memory cell wherein each subsequent programming voltage is less than its respective initial programming voltage.

10. The memory device of claim 9 wherein the control logic is further configured to receive a program/write command comprising the plurality of respective states.

11. The memory device of claim 9 wherein the control logic is further configured to access the memory cell characteristics that are stored in memory.

12. The memory device of claim 9 wherein the control logic is further configured to control generation of a larger initial programming voltage for a respective memory cell when the respective memory cell characteristic indicates that a threshold voltage of the respective memory cell does not move easily in response to a program disturb condition.

13. The memory device of claim 9 wherein the control logic is further configured to determine a voltage distance that a respective threshold voltage of a memory cell needs to move to reach a predetermined percentage of its respective state to be programmed and the control logic is further configured to determine a programming voltage to move the respective threshold the voltage distance.

14. The memory device of claim 13 wherein the control logic is further configured to adjust the programming voltage in response to the respective memory cell characteristics for the memory cell.

15. A solid state bulk storage device comprising:
a memory device comprising an array of memory cells coupled to control logic;
a controller configured to control operation of the solid state bulk storage device; and
a read/write channel configured to couple the controller to the memory device;
wherein the controller is configured to receive a program/write command comprising desired program states for respective memory cells, the read/write channel further configured to receive a digital representation of a respective threshold voltage for each of the desired program states and convert the digital representation to an analog representation of the respective threshold voltage; and
and further wherein the control logic is configured to control programming of a plurality of memory cells of the array of memory cells, the control logic configured to receive the analog representations of the respective threshold voltages of respective states to be programmed, determine memory cell characteristics data for the plurality of memory cells, control generation of an initial programming voltage for each of the plurality of memory cells in response to the cell characteristics data and the analog representation of the respective threshold voltage to be programmed into each memory cell wherein the initial programming voltage programs each of the plurality of memory cells to a respective interim state, and control generation of at least one subsequent programming voltage for each of the plurality of memory cells such that each subsequent programming voltage is generated in response to the respective interim state and a programmed state of each memory cell wherein each subsequent programming voltage is less than its respective initial programming voltage.

16. The solid state bulk storage device of claim 15 wherein the read/write channel comprises analog-to-digital conversion devices.

17. The solid state bulk storage device of claim 15 wherein the read/write channel is part of the memory device.

18. The solid state bulk storage device of claim 15 and further comprising a plurality of memory devices coupled to the controller through the read/write channel.

19. The solid state bulk storage device of claim 15 wherein the read/write channel is a signal processor.

20. The solid state bulk storage device of claim 15 wherein the controller is coupled to the read/write channel through a data interface and a control interface.

* * * * *